(12) United States Patent
Kaneko

(10) Patent No.: US 12,155,370 B2
(45) Date of Patent: Nov. 26, 2024

(54) ACOUSTIC WAVE DEVICE, MODULE HAVING THE SAME

(71) Applicant: Sanan Japan Technology Corporation, Tokyo (JP)

(72) Inventor: Hiroomi Kaneko, Tokyo (JP)

(73) Assignee: Sanan Japan Technology Corporation, Tokyo (JP)

( * ) Notice: Subject to any disclaimer, the term of this patent is extended or adjusted under 35 U.S.C. 154(b) by 325 days.

(21) Appl. No.: 17/348,658

(22) Filed: Jun. 15, 2021

(65) Prior Publication Data

US 2022/0286110 A1 Sep. 8, 2022

(30) Foreign Application Priority Data

Mar. 5, 2021 (JP) .................................. 2021-035048

(51) Int. Cl.
*H03H 9/54* (2006.01)
*H03H 9/13* (2006.01)

(52) U.S. Cl.
CPC ................ *H03H 9/54* (2013.01); *H03H 9/13* (2013.01)

(58) Field of Classification Search
CPC .................................... H03H 9/54; H03H 9/13
See application file for complete search history.

(56) References Cited

U.S. PATENT DOCUMENTS

| | | | |
|---|---|---|---|
| 2014/0113571 A1 | 4/2014 | Fujiwara et al. | |
| 2016/0105158 A1 | 4/2016 | Fujiwara et al. | |
| 2017/0093373 A1 | 3/2017 | Fujiwara et al. | |
| 2019/0267968 A1* | 8/2019 | Hamatani | ................ H03H 9/72 |
| 2021/0288628 A1* | 9/2021 | Nishimura | ............. H03H 9/145 |

FOREIGN PATENT DOCUMENTS

| | | |
|---|---|---|
| JP | 2007189501 A | 7/2007 |
| JP | 2012049758 A | 3/2012 |
| JP | 2012231437 A | 11/2012 |
| JP | 2014120841 A | 6/2014 |
| JP | 2020155967 A | 9/2020 |
| WO | 2018021242 A1 | 2/2018 |
| WO | 2018093508 A1 | 5/2018 |

OTHER PUBLICATIONS

English Translation of Notice of Reasons for Refusal for Japanese Application No. 2021-035048, mailed Jul. 13, 2021.

* cited by examiner

*Primary Examiner* — Samuel S Outten
(74) *Attorney, Agent, or Firm* — Dorsey & Whitney LLP

(57) ABSTRACT

An acoustic wave device includes a substrate, a transmission filter formed on the substrate, a reception filter formed on the substrate, a transmission ground pad of the transmission filter, the transmission ground pad is formed on the substrate, and a reception ground pad of the reception filter, the reception ground pad is formed on the substrate. The transmission filter includes a plurality of series resonators and a plurality of parallel resonators. The plurality of parallel resonators includes a first parallel resonator electrically connected to the reception ground pad.

8 Claims, 7 Drawing Sheets

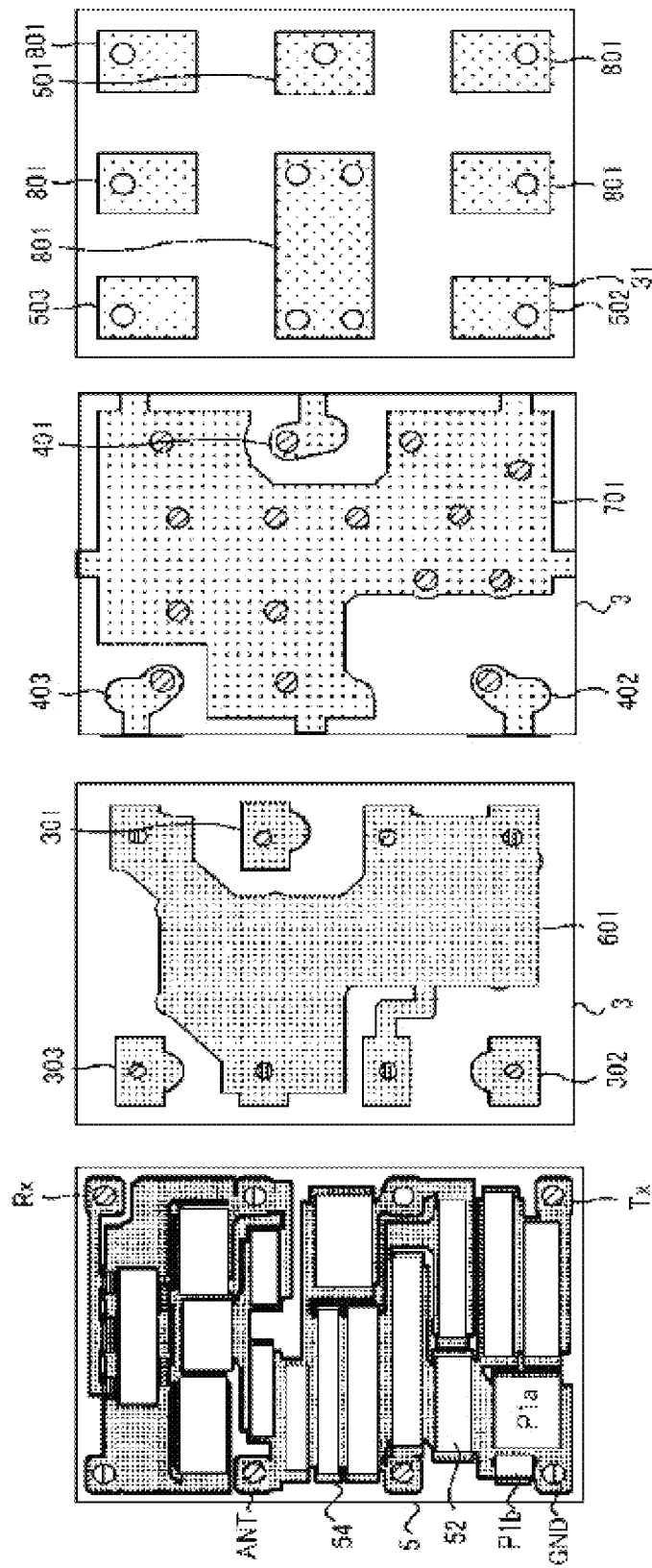

ACOUSTIC WAVE DEVICE, MODULE HAVING THE SAME

CROSS-REFERENCE TO RELATED APPLICATION(S)

This application claims priority to Japanese Application No. 2021-035048 filed Mar. 5, 2021, which is incorporated herein by reference, in its entirety, for any purpose.

BACKGROUND

Field

The present disclosure relates to an acoustic wave device and a module having the acoustic wave device.

Background Art

JP2014-120841A (Patent Document 1) discloses an electronic component. According to the electronic component, the isolation characteristics can be improved.

However, in the electronic component described in Patent Document 1, it is necessary to provide an additional circuit in the acoustic wave device. Therefore, it is impossible to miniaturize the electronic component.

SUMMARY

The present disclosure has been made to solve the above-described problems. It is an object of the present disclosure to provide a smaller sized acoustic wave device having excellent isolation characteristics and to provide a module including the acoustic wave device.

In some examples, an acoustic wave device includes a substrate, a transmission filter formed on the substrate, a reception filter formed on the substrate, a transmission ground pad of the transmission filter, the transmission ground pad is formed on the substrate, and a reception ground pad of the reception filter, the reception ground pad is formed on the substrate, wherein the transmission filter includes a plurality of series resonators and a plurality of parallel resonators, and the plurality of parallel resonators includes a first parallel resonator electrically connected to the reception ground pad.

In some examples, the first parallel resonator is not electrically connected to the transmission ground pad.

In some examples, the first parallel resonator is a parallel resonator disposed at a position farthest from an input terminal of the transmission filter among the plurality of parallel resonators.

In some examples, the first parallel resonator is one of the resonators divided in parallel in the final stage of the transmission filter.

In some examples, a capacitance of the first parallel resonator is less than an average value of capacitances of the plurality of parallel resonators.

In some examples, a capacitance of the first parallel resonator is the smallest capacitance of the plurality of parallel resonators.

In some examples, the first parallel resonator has a resonant frequency that approximates a frequency of the highest frequency of the passband of the reception filter.

In some examples, the substrate is a substrate in which a piezoelectric substrate and a substrate made of sapphire, silicon, alumina, spinel, quartz, or glass are bonded to each other.

In some examples, an area of a ground electrode electrically connected to the reception ground pad is larger than an area of a ground electrode electrically connected to the transmission ground pad.

In some examples, a module includes the acoustic wave device.

BRIEF DESCRIPTION OF THE DRAWINGS

FIG. 3A shows a device chip of an acoustic wave device according to the comparative example;

FIG. 3B shows a first layer of the wiring board of the acoustic device of the comparative example;

FIG. 3C shows a second layer of the wiring board of the acoustic wave device of the comparative example;

FIG. 3D shows an external connection terminal of the acoustic wave device of the comparative example;

DETAILED DESCRIPTION

Figure 1:
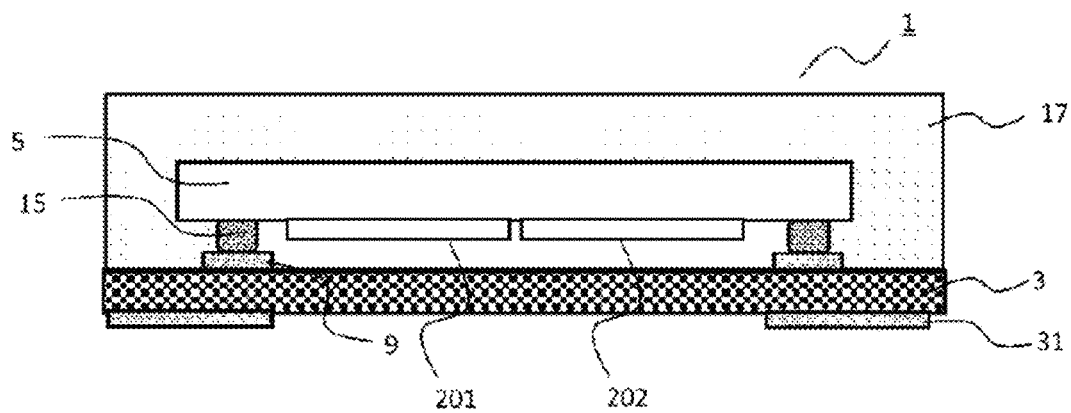
FIG. 1 is a longitudinal sectional view of an acoustic wave device in the first embodiment.

Embodiments will be explained with reference to the accompanying drawings. In the drawings, the same or corresponding portions are denoted by the same reference symbols. Duplicate descriptions of such portions are appropriately simplified or omitted.

First Embodiment

FIG. 1 is a longitudinal sectional view of an acoustic wave device in the first embodiment.

FIG. 1 shows an example of an acoustic wave device which is a duplexer as an acoustic wave device 1.

As shown in FIG. 1, the acoustic wave device 1 includes a wiring board 3, a plurality of external connection terminals 31, a plurality of electrode pads 9, a plurality of bumps 15, a device chip 5 and a sealing portion 17.

For example, the wiring board 3 is a multilayer board made of resin. For example, the wiring board 3 is a Low-Temperature Co-fired Ceramics (LTCC) multilayer substrate made of a plurality of dielectric layers.

The plurality of external connection terminals 31 are formed on the lower surface of the wiring board 3.

The plurality of electrode pads 9 are formed on the main surface of the wiring board 3. For example, the electrode pads 9 are formed of an alloy containing copper or copper. For example, the thickness of the electrode pads 9 is 10 μm to 20 μm.

The plurality of bumps 15 are formed on the upper surface of each of the plurality of electrode pads 9. For example, the bumps 15 are gold bumps. For example, the height of the bumps 15 are 20 μm to 50 μm.

For example, the device chip 5 is a substrate formed of a piezoelectric single crystal such as lithium tantalate, lithium niobate, or quartz. For example, the device chip 5 is a substrate formed of piezoelectric ceramics. For example, the device chip 5 is a substrate in which the piezoelectric substrate and the supporting substrate are bonded. For example, the support substrate may be a substrate formed of sapphire, silicon, alumina, spinel, quartz, or glass.

The device chip 5 is mounted by flip-chip bonding to the wiring board 3 via the bumps 15. The device chip 5 is electrically connected to the plurality of electrode pads 9 via the plurality of bumps 15.

The device chip 5 is a substrate on which functional elements are formed. For example, a transmission filter 201 and a reception filter 202 are formed on the main surface of the device chip 5.

The transmission filter 201 is formed so that an electrical signal in a desired frequency band can pass. For example, the transmission filter 201 is a ladder-type filter consisting of a plurality of series resonators and a plurality of parallel resonators.

The reception filter 202 is formed so that an electrical signal in a desired frequency band can pass. For example, the reception filter 202 is a ladder-type filter consisting of a plurality of series resonators and a plurality of parallel resonators.

The sealing portion 17 is formed so as to cover the device chip 5. For example, the sealing portion 17 is formed of an insulator such as a synthetic resin. For example, the sealing portion 17 is formed of metal.

When the sealing portion 17 is formed of a synthetic resin, the synthetic resin is an epoxy resin, a polyimide, or the like. Preferably, the sealing portion 17 is formed of an epoxy resin by using a low-temperature curing process.

Next, the configurations of the acoustic wave device 1 of the present disclosure and the acoustic wave device of the comparative example will be described with reference to FIGS. 2 and 3. FIG. 2 is a diagram showing a configuration of the acoustic wave device in the first embodiment. FIG. 3 is a diagram showing a configuration of the acoustic wave device of the comparative example.

Figures 2A, 2B, 2C, 2D:
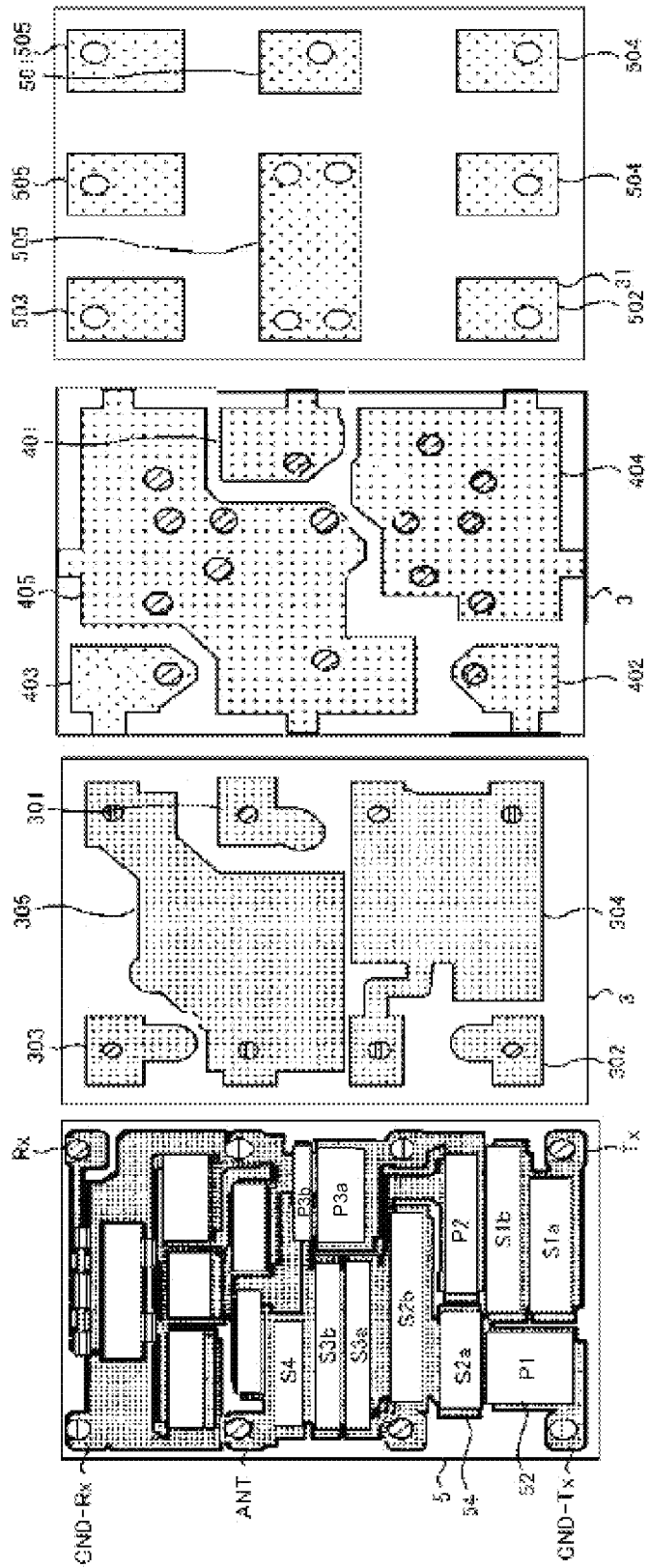
FIG. 2A shows the device chip of the acoustic wave device in the first embodiment.
FIG. 2B shows a first layer of the wiring board of the acoustic wave device in the first embodiment.
FIG. 2C shows a second layer of the wiring board of the acoustic wave device in the first embodiment.
FIG. 2D shows external connection terminals of the wiring board of the acoustic wave device in the first embodiment.

FIG. 2A shows the device chip 5 of the acoustic wave device 1 in the first embodiment. FIG. 2B shows a first layer of the wiring board 3 of the acoustic wave device 1 in the first embodiment. FIG. 2C shows a second layer of the wiring board 3 of the acoustic wave device 1 in the first embodiment. FIG. 2D shows external connection terminals 31 of the wiring board 3 of the acoustic wave device 1 in the first embodiment.

In FIG. 2A, the device chip 5 includes a plurality of acoustic wave elements 52 and a wiring pattern 54.

The plurality of acoustic wave elements 52 include a plurality of series resonators S1$a$, S1$b$, S2$a$, S2$b$, S3$a$, S3$b$, S4 and a plurality of parallel resonators P1, P2, P3$a$, P3$b$.

The plurality of series resonators S1$a$, S1$b$, S2$a$, S2$b$, S3$a$, S3$b$, S4 and the plurality of parallel resonators P1, P2, P3$a$, P3$b$ are formed so as to function as the transmission filter 201. Other series resonators and other parallel resonators are formed to function as the reception filter 202.

For example, the wiring pattern 54 is formed of a suitable metal or alloy such as silver, aluminum, copper, titanium, or palladium. For example, the wiring pattern 54 is formed by a laminated metal film formed by laminating a plurality of metal layers. For example, the thickness of the wiring pattern 54 is 150 nm to 400 nm.

The wiring pattern 54 includes an antenna pad ANT, a transmission pad Tx, a reception pad Rx, a plurality of transmission ground pads GND-Tx and a plurality of reception ground pads GND-Rx. The wiring pattern 54 is electrically connected to the acoustic wave elements 52.

In FIG. 2B, the wiring board 3 includes a first antenna electrode 301, a first transmission electrode 302, a first reception electrode 303, a first transmission ground electrode 304 and a first reception ground electrode 305.

The first antenna electrode 301, the first transmission electrode 302, the first reception electrode 303, the first transmission ground electrode 304 and the first reception ground electrode 305 are not electrically connected.

In the mounting state, the first antenna electrode 301 is electrically connected to the antenna pad ANT. The first transmission electrode 302 is electrically connected to the transmission pad Tx. The first reception electrode 303 is electrically connected to the reception pad Rx. The first transmission ground electrode 304 is electrically connected to the plurality of transmission ground pads GND-Tx. The first reception ground electrode 305 is electrically connected to the plurality of reception ground pads GND-Rx.

In FIG. 2C, the wiring board 3 includes a second antenna electrode 401, a second transmission electrode 402, a second reception electrode 403, a second transmission ground electrode 404 and a second reception ground electrode 405.

The second antenna electrode 401, the second transmission electrode 402, the second reception electrode 403, the second transmission ground electrode 404 and the second reception ground electrode 405 are not electrically connected.

In the mounted state, the second antenna electrode 401 is electrically connected to the first antenna electrode 301. The second transmission electrode 402 is electrically connected to the first transmission electrode 302. The second reception electrode 403 is electrically connected to the first reception electrode 303. The second transmission ground electrode 404 is electrically connected to the first transmission ground electrode 304. The second reception ground electrode 405 is electrically connected to the first reception ground electrode 305.

In FIG. 2D, the external connection terminals 31 includes an antenna terminal 501, a transmission terminal 502, a reception terminal 503, a plurality of transmission ground terminals 504 and a plurality of reception ground terminals 505.

The antenna terminal 501, the transmission terminal 502, the reception terminal 503, the plurality of transmission ground terminals 504 and the plurality of reception ground terminals 505 are not electrically connected.

In the mounted state, the antenna terminal 501 is electrically connected to the second antenna electrode 401. The Transmission terminal 502 is electrically connected to the second transmission electrode 402. The reception terminal 503 is electrically connected to the second reception electrode 403. The plurality of transmission ground terminals 504 are electrically connected to the second transmission ground electrode 404. The plurality of transmission ground terminals 504 are not electrically connected to the second reception ground electrode 405.

The plurality of reception ground terminals 505 are electrically connected to the second reception ground electrode 405. The plurality of reception ground terminals 505 are not electrically connected to the second transmission ground electrode 404.

The antenna terminal 501 is an output terminal of the transmission filter 201. The antenna terminal 501 is an input terminal of the reception filter 202. The transmission terminal 502 is an input terminal of the transmission filter 201. The reception terminal 503 is an output terminal of the reception filter 202. The plurality of transmission ground terminals 504 are ground terminals of the transmission filter 201. The plurality of reception ground terminals 505 are ground terminals of the reception filter 202.

When the electrical signals are input to the transmission terminal 502, the electrical signals reach the transmission filter 201. Of the electrical signals, the electrical signal of the desired frequency band passes through the transmission filter 201. As a result, the electrical signal of the desired frequency band is output from the antenna terminal.

When the electrical signals are input to the antenna terminal 501, the electrical signals reach the reception filter 202. Of the electrical signals, the electrical signal of the desired frequency band passes through the reception filter 202. As a result, the electrical signal of the desired frequency band is output from the reception terminal 503.

In this embodiment, the parallel resonator P3$b$, as the first parallel resonator, is electrically connected to the reception ground-pads GND-Rx. The parallel resonator P3$b$ is not electrically connected to the transmission ground pads GND-Tx.

The parallel resonator P3$b$ is arranged farther from the transmission terminal 502 than the parallel resonators P1, P2, P3$a$.

The parallel resonator P3$b$ is one of the resonators divided in parallel at the final stage of the transmission filter 201. Specifically, in the transmission filter 201, the parallel resonator of the final stage is divided in parallel to the parallel resonator P3$a$ and the parallel resonator P3$b$.

The capacitance of the parallel resonator P3$b$ is less than the average value of the capacitances of the plurality of parallel resonators P1, P2, P3$a$, P3$b$. The capacitance of the parallel resonator P3$b$ is the smallest of the parallel resonators P1, P2, P3$a$, P3$b$.

For example, the parallel resonator P3$b$ has a resonant frequency that approximates the frequency of the highest frequency of the passband of the reception filter 202.

The area of the first reception ground electrode 305 and the area of the second reception ground electrode 405 are larger than the area of the first transmission ground electrode 304 and the area of the second transmission ground electrode 404.

FIG. 3A shows a device chip of an acoustic wave device according to the comparative example. FIG. 3B shows a first layer of the wiring board of the acoustic wave device of the comparative example. FIG. 3C shows a second layer of the wiring board of the acoustic wave device of the comparative example. FIG. 3D shows external connection terminals of the acoustic wave device of the comparative example.

In FIG. 3A, the device chip 5 includes, similarly to FIG. 2A, a plurality of acoustic wave elements 52 and the wiring pattern 54. The device chip includes a parallel resonator P1$b$ instead of the parallel resonator P3$b$. The device chip includes a plurality of ground pads GND instead of the plurality of transmission ground pads GND-Tx and the plurality of reception ground pads GND-Rx.

In FIG. 3B, the wiring board 3 includes, similarly to FIG. 2B, the first antenna electrode 301, the first transmission electrode 302 and the first reception electrode 303. The wiring board 3 includes a first ground electrode 601 instead of the first transmission ground electrode 304 and the first reception ground electrode 305.

In the mounting state, the first ground electrode 601 is electrically connected to the ground pad GND.

In FIG. 3C, the wiring board 3 includes, similarly to FIG. 2C, the second antenna electrode 401, the second transmission electrode 402 and the second reception electrode 403. The wiring board 3 includes a second ground electrode 701 instead of the second transmission ground electrode 404 and the second reception ground electrode 405.

In the mounted state, the second ground electrode 701 is electrically connected to the first ground electrode 601.

In FIG. 3D, the external connection terminals 31 includes, similarly to FIG. 2D, an antenna terminal 501, the transmission terminal 502 and the reception terminal 503. The external connection terminals 31 includes a plurality of ground terminals 801 instead of the plurality of transmission ground terminals 504 and the plurality of reception ground terminals 505.

In the mounting state, the plurality of ground terminals 801 are electrically connected to the second ground electrode 701.

Figure 4:
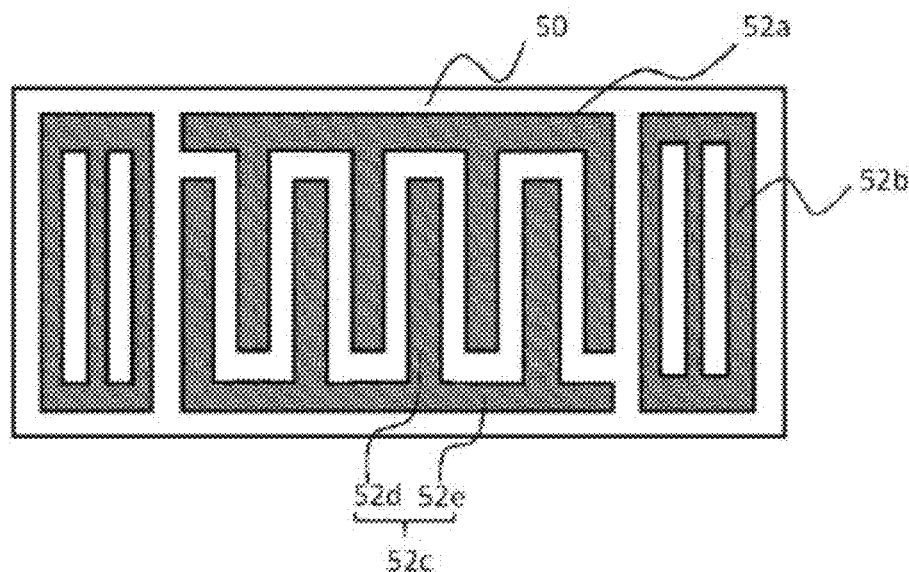
FIG. 4 is a diagram showing an example of an acoustic wave element of the acoustic wave device in the first embodiment.

Next, with reference to FIG. 4, an example of the acoustic wave element 52 is explained.

FIG. 4 is a diagram showing an example of an acoustic wave element of the acoustic wave device in the first embodiment.

As shown in FIG. 4, the IDT (Interdigital Transducer) 52$a$ and a pair of reflectors 52$b$ are formed on the main surface of the device chip 5. The IDT 52$a$ and the pair of reflectors 52$b$ are provided so as to excite surface-acoustic waves.

For example, the IDT 52$a$ and the pair of reflectors 52$b$ are formed of an alloy of aluminum and copper. For example, the IDT 52$a$ and the pair of reflectors 52$b$ are formed of suitable metals such as titanium, palladium, silver, and the like, or alloys thereof. For example, the IDT 52$a$ and the pair of reflectors 52$b$ are formed by a laminated metal film in which a plurality of metal layers are laminated. For example, the thickness of the IDT 52$a$ and the pair of reflectors 52$b$ is 150 nm to 400 nm.

The IDT 52$a$ includes a pair of comb-shaped electrodes 52$c$. The pair of comb-shaped electrodes 52$c$ are opposed to each other. The comb-shaped electrodes 52$c$ includes a plurality of electrode fingers 52$d$ and a bus bar 52$e$. The plurality of electrode fingers 52$d$ are arranged in the longitudinal direction. The bus bar 52$e$ connects the plurality of electrode fingers 52$d$.

One of the pair of reflectors 52$b$ adjoins one side of the IDT 52$a$. The other of the pair of reflectors 52$b$ adjoins the other side of the IDT 52$a$.

Figure 5:
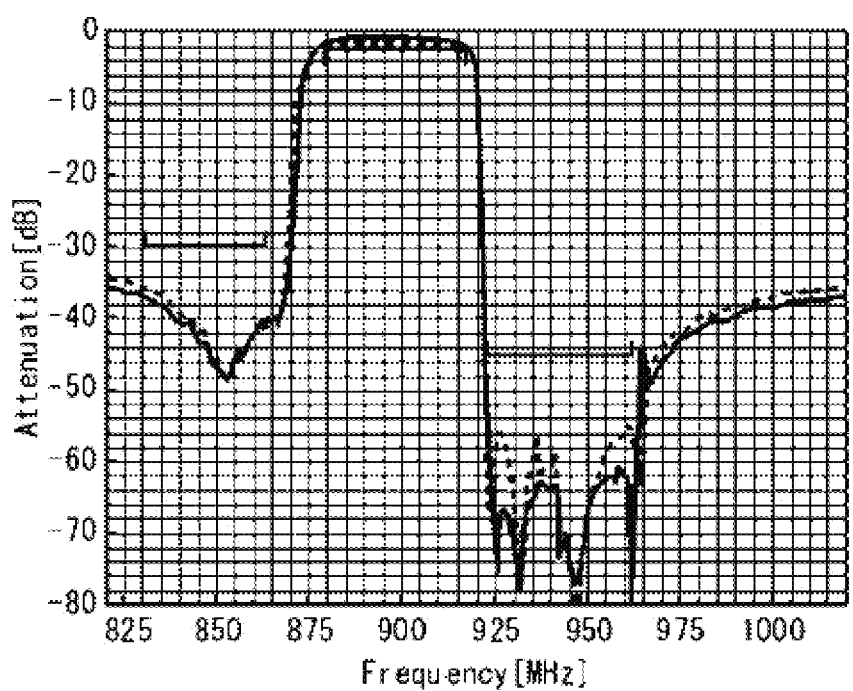
FIG. 5 is a diagram showing the passing characteristics of the transmission filter of the acoustic wave device and the comparative example in the first embodiment.

Next, the pass characteristics of the transmission filter 201 will be described with reference to FIG. 5. FIG. 5 shows the passing characteristics of the transmission filter of the acoustic wave device of the first embodiment and the comparative example.

The waveform of the solid line indicates the pass characteristics of the transmission filter 201 of the first embodiment in the narrow band. The waveform of the broken line in the narrow band indicates the pass characteristics of the transmission filter of the comparative example.

As shown in FIG. 5, the pass characteristics of the transmission filter 201 of the present embodiment are improved over the pass characteristics of the transmission filter of the comparative example.

Figure 6:
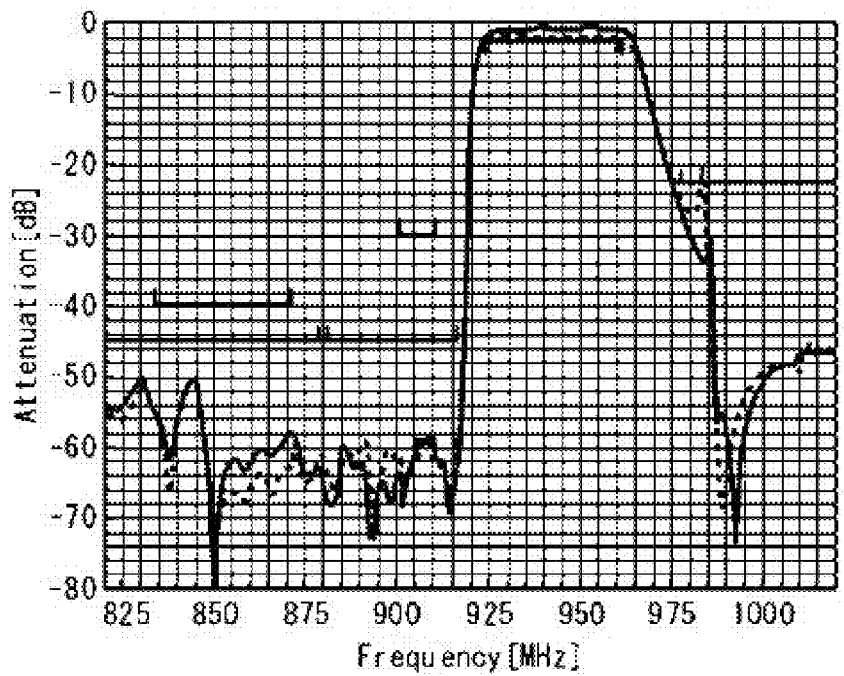
FIG. 6 is a diagram showing the passing characteristics of the reception filter of the acoustic wave device and the comparative example in the first embodiment.

Next, the pass characteristics of the reception filter 202 will be described with reference to FIG. 6. FIG. 6 is a diagram showing pass characteristics of the reception filter of the acoustic wave device of the first embodiment and the comparative example.

The waveform of the solid line indicates the pass characteristics of the reception filter 202 of the first embodiment in the narrow band. The waveform of the broken line indicates the pass characteristics of the reception filter of the comparative example in the narrow band.

As shown in FIG. 6, the pass characteristics of the reception filter 202 of the present embodiment is improved over the pass characteristics of the reception filter of the comparative example.

Figure 7:
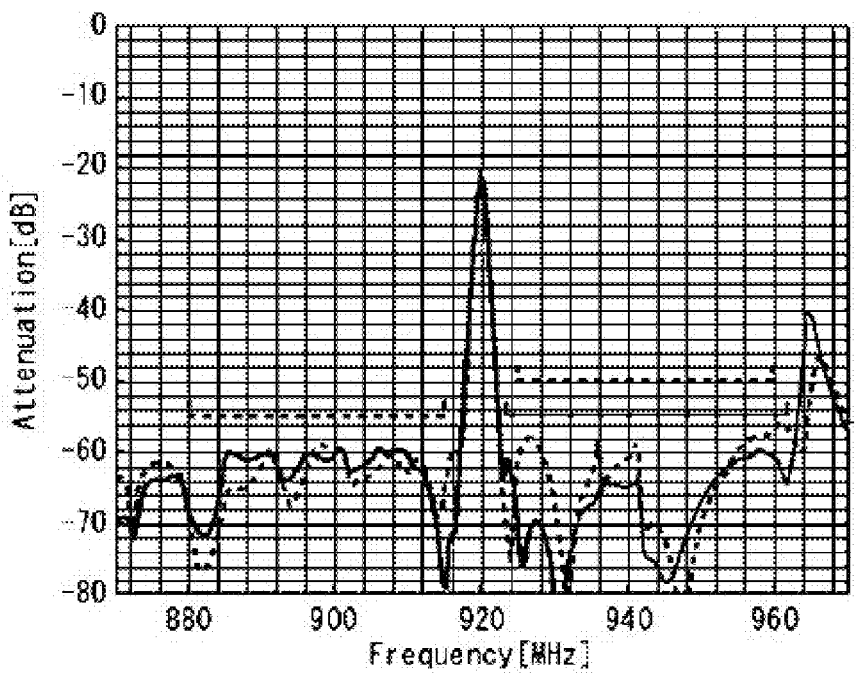
FIG. 7 is a diagram showing the isolation characteristics of the acoustic wave device and the comparative example in the first embodiment.

Next, the isolation characteristics will be described with reference to FIG. 7. FIG. 7 is a diagram showing isolation characteristics of the acoustic wave device according to the first embodiment and the comparative example.

The waveform of the solid line shows the isolation characteristics of the acoustic wave device 1 of the first embodiment in the narrow band. The waveform of the broken line indicates the isolation characteristics of the comparative example in the narrow band.

As shown in FIG. 7, the isolation characteristics of the acoustic wave device 1 of the present embodiment is improved over the isolation characteristics of the comparative example.

In particular, in the region slightly higher frequency side than 960 MHz, isolation characteristics is improved by the parallel resonator P3b.

Figure 8:
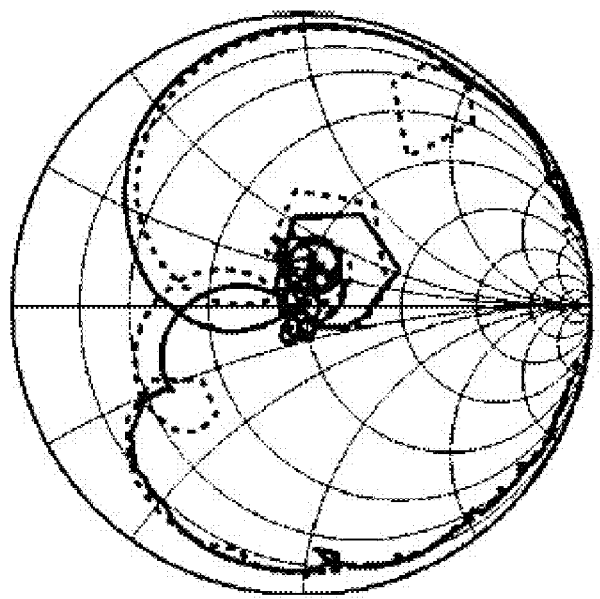
FIG. 8 is a diagram showing an antenna impedance of the acoustic wave device and the comparative example in the first embodiment.

Next, the antenna impedance will be described with reference to FIG. 8. FIG. 8 is a diagram showing an antenna impedance of the acoustic wave device according to the first embodiment and the comparative example.

The waveform of the solid line shows the antenna impedance of the acoustic wave device 1 of the first embodiment. The waveform of the dashed line shows the antenna impedance of the comparative example.

As shown in the Smith chart of FIG. 8, the antenna impedance of the acoustic wave device 1 of the present embodiment is improved over the antenna impedance of the comparative example.

Figure 9:
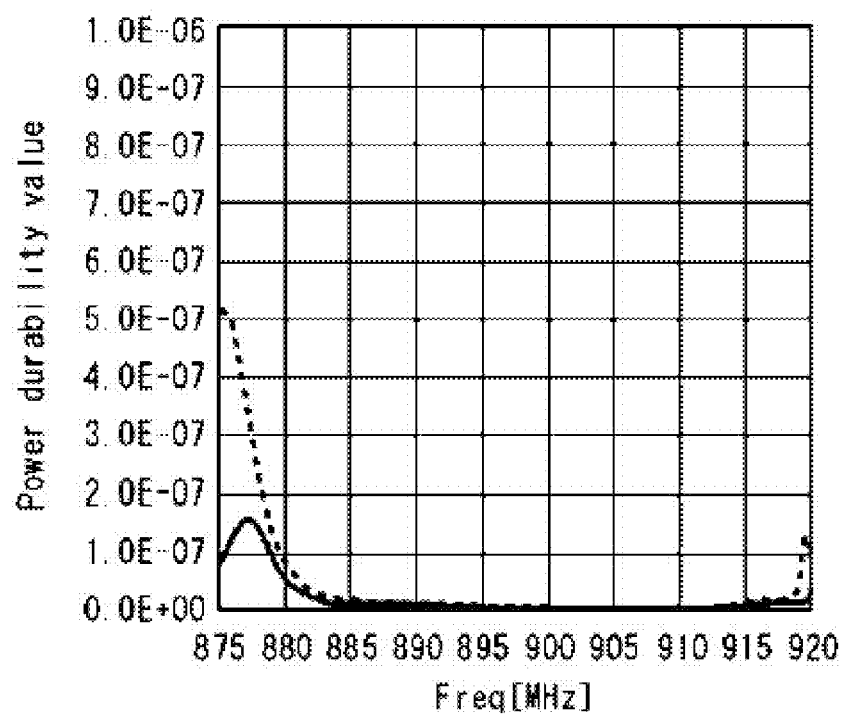
FIG. 9 is a diagram showing a first example of power durability in the acoustic wave device and the comparative example in the first embodiment.

Next, a first example of power durability will be described with reference to FIG. 9. FIG. 9 is a diagram showing a first example of power durability of the acoustic wave device according to the first embodiment and the comparative example.

The waveform of the solid line shows power durability of the parallel resonator P1 of the acoustic wave device 1 of the first embodiment. The waveform of the dashed line shows power durability of the parallel resonator of the comparative example which is arranged at the same position as the parallel resonator P1.

As shown in FIG. 9, power durability of the parallel resonator P1 of this embodiment is improved over power durability of the parallel resonator arranged in the same position as the parallel resonator P1 in the comparative example.

Figure 10:
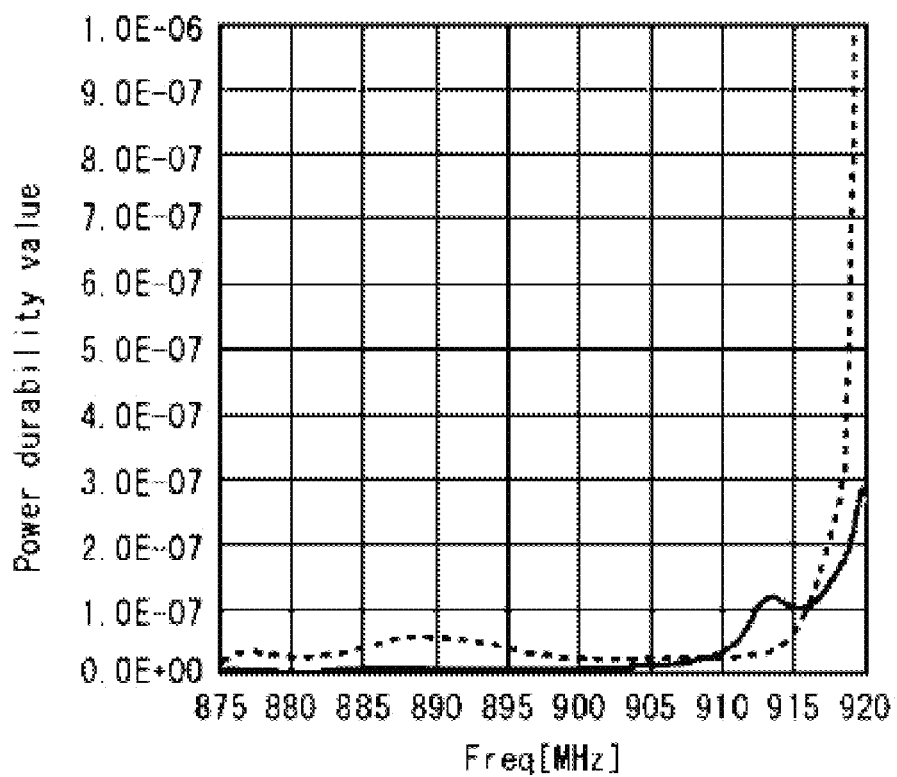
FIG. 10 is a diagram showing a second example of power durability in the acoustic wave device and the comparative example in the first embodiment.

Next, a second example of power durability will be described with reference to FIG. 10. FIG. 10 is a diagram showing a second example of power durability of the acoustic wave device according to first embodiment and the comparative example.

The waveform of the solid line shows power durability of the parallel resonator P3b of the acoustic wave device 1 of the first embodiment. The waveform of the dashed line shows power durability of the parallel resonator P1b of the comparative example.

As shown in FIG. 10, power durability of the parallel resonator P3b of this embodiment is slightly inferior to power durability of the parallel resonator P1b in the comparative example.

However, power durability of the parallel resonator P3b receives power supply simultaneously with the series resonator S4. Further, the parallel resonator P3b is disposed at a position farthest from the transmission terminal 502. Therefore, the parallel resonator P3b is less likely to break than the parallel resonator P1b.

According to the first embodiment described above, the parallel resonator P3b is electrically connected to the reception ground pads GND-Rx. Therefore, it is possible to provide a smaller acoustic wave device 1 having excellent isolation characteristics.

Further, the parallel resonator P3b is not electrically connected to the transmission ground pads GND-Tx. Therefore, it is possible to provide an acoustic wave device 1 which is more excellent in isolation characteristics.

Further, the parallel resonator P3b is arranged farther from the transmission terminal 502 than the plurality of parallel resonators P1, P2, P3a. Therefore, the parallel resonator P3b can be made hard to break.

Further, the parallel resonator P3b is one of the resonator which is divided in parallel at the final stage of the transmission filter 201. Therefore, the parallel resonator P3b can be made hard to break.

Also, the capacitance of the parallel resonator P3b is smaller than the average value of the capacitance of the plurality of parallel resonators P1, P2, P3a, P3b. Therefore, the insertion loss of the transmission filter 201 can be reduced.

Also, the capacitance of the parallel resonator P3b is the smallest capacitance among the plurality of parallel resonators P1, P2, P3a, P3b. Therefore, the insertion loss of the transmission filter 201 can be further reduced.

The parallel resonator P3b has a resonant frequency that approximates the frequency of the highest frequency of the passband of the reception filter 202. Therefore, it is possible to provide an acoustic wave device 1 which is more excellent in isolation characteristics.

The substrate of the device chip 5 is a substrate in which a piezoelectric substrate and a substrate made of sapphire, silicon, alumina, spinel, quartz or glass are bonded to each other. Therefore, it is possible to provide an acoustic wave device 1 having better temperature characteristics.

Further, the area of the first reception ground electrode 305 and the area of the second reception ground electrode 405 are larger than the area of the first transmission ground electrode 304 and the area of the second transmission ground electrode 404. Therefore, even when a DMS filter is used as the reception filter 202, the floor level of the reception filter 202 can be appropriately set.

Second Embodiment

Figure 11:
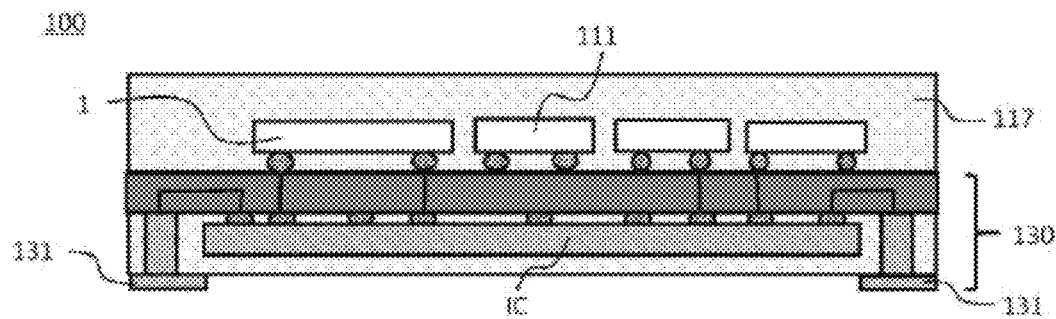
FIG. 11 is a longitudinal sectional view of a module to which the acoustic wave device is applied in the second embodiment.

FIG. 11 is a longitudinal sectional view of a module to which the acoustic wave device is applied in accordance with the second embodiment. The same or corresponding portions as those of first Embodiment are denoted by the same reference numerals. Description of this part is omitted.

As shown in FIG. 11, the module 100 includes a wiring board 130, a plurality of external connection terminals 131, an integrated circuit component IC, the acoustic wave device 1, a inductor 111 and the sealing portion 117.

The wiring board 130 is equivalent to the wiring board 3 of the first embodiment.

The plurality of external connection terminals 131 are formed on the lower surface of the wiring board 130. The plurality of external connection terminals 131 are mounted on a motherboard of a preset mobile communication terminal.

The integrated circuit component IC is mounted inside the wiring board 130. Integrated circuit component IC includes a switching circuit and a low-noise amplifier.

The acoustic wave device 1 is mounted on the main surface of the wiring board 130.

The inductor 111 is mounted on the main surface of the wiring board 130. The inductor 111 is mounted for impedance matching. For example, the inductor 111 may be an Integrated Passive Device (IPD).

The sealing portion 117 seals a plurality of electronic components including the acoustic wave device 1.

According to the second embodiment described above, the module 100 includes an acoustic wave device 1. Therefore, it is possible to provide the module 100 which is smaller and more excellent in isolation characteristics.

While several aspects of at least one embodiment have been described, it is to be understood that various modifications and improvements will readily occur to those skilled in the art. Such modifications and improvements are intended to be part of the present disclosure and are intended to be within the scope of the present disclosure.

It is to be understood that the embodiments of the methods and apparatus described herein are not limited in application to the structural and ordering details of the components set forth in the foregoing description or illustrated in the accompanying drawings. Methods and apparatus may be implemented in other embodiments and implemented or implemented in various aspects.

Specific implementations are given here for illustrative purposes only and are not intended to be limiting.

The phraseology and terminology used in the present disclosure are for the purpose of description and should not be regarded as limiting. The use of "including," "comprising," "having," and variations thereof herein means the inclusion of the items listed hereinafter and equivalents thereof, as well as additional items.

The reference to "or" may be construed so that any term described using "or" may be indicative of one, more than one, and all of the terms of that description.

References to front, back, left, right, top, bottom, and side are intended for convenience of description. Such references are not intended to limit the components of the present disclosure to any one positional or spatial orientation. Accordingly, the foregoing description and drawings are by way of example only.

The invention claimed is:

1. An acoustic wave device, comprising:
a substrate;
a transmission filter formed on the substrate;
a reception filter formed on the substrate;
a transmission ground pad of the transmission filter, the transmission ground pad is formed on the substrate; and
a reception ground pad of the reception filter, the reception ground pad is formed on the substrate, wherein
the transmission filter includes a plurality of series resonators and a plurality of parallel resonators,
the plurality of parallel resonators includes a first parallel resonator electrically connected to the reception ground pad,
the plurality of parallel resonators includes a second parallel resonator electrically connected to the transmission ground pad, and
the first parallel resonator and the second parallel resonator are resonators divided in a final stage of the transmission filter, the final stage is disposed at a position farthest from an input terminal of the transmission filter among the plurality of parallel resonators.

2. The acoustic wave device according to claim 1, wherein the first parallel resonator is not electrically connected to the transmission ground pad.

3. The acoustic wave device according to claim 1, wherein a capacitance of the first parallel resonator is less than an average value of capacitances of the plurality of parallel resonators.

4. The acoustic wave device according to claim 1, wherein a capacitance of the first parallel resonator is the smallest capacitance of the plurality of parallel resonators.

5. The acoustic wave device according to claim 1, wherein the first parallel resonator has a resonant frequency that approximates a frequency of the highest frequency of the passband of the reception filter.

6. The acoustic wave device according to claim 1, wherein the substrate is a substrate in which a piezoelectric substrate and a substrate made of sapphire, silicon, alumina, spinel, quartz, or glass are bonded to each other.

7. The acoustic wave device according to claim 1, comprising a transmission ground electrode electrically connected to the transmission ground pad, and a reception ground electrode electrically connected to the reception ground pad, wherein an area of the reception ground electrode is larger than an area of the transmission ground electrode.

8. A module comprising the acoustic wave device according to claim 1.

* * * * *